US006580272B2

(12) United States Patent
Freed et al.

(10) Patent No.: US 6,580,272 B2
(45) Date of Patent: Jun. 17, 2003

(54) NUCLEAR MAGNETIC RESONANCE LOGGING BASED ON STEADY-STATE FREE PRECESSION

(75) Inventors: Denise Freed, Mount Kisco, NY (US); Martin D. Hürlimann, Ridgefield, CT (US); Ulrich Scheven, Bethel, CT (US)

(73) Assignee: Schlumberger Technology Corporation, Ridgefield, CT (US)

( * ) Notice: Subject to any disclaimer, the term of this patent is extended or adjusted under 35 U.S.C. 154(b) by 0 days.

(21) Appl. No.: 09/992,815

(22) Filed: Nov. 6, 2001

(65) Prior Publication Data

US 2003/0085702 A1 May 8, 2003

(51) Int. Cl.[7] ................................................. G01V 3/00
(52) U.S. Cl. ..................................... 324/303; 324/300
(58) Field of Search ............................... 324/303, 300, 324/306, 307, 309, 312, 314, 318, 322

(56) References Cited

U.S. PATENT DOCUMENTS

| 5,023,551 | A | 6/1991 | Kleinberg et al. | 324/303 |
|---|---|---|---|---|
| 5,055,787 | A | 10/1991 | Kleinberg et al. | 324/303 |
| 5,055,788 | A | 10/1991 | Kleinberg et al. | 324/303 |
| 5,153,514 | A | 10/1992 | Griffin et al. | 324/303 |
| 6,310,478 | B1 * | 10/2001 | Heid | 324/309 |
| 6,452,387 | B1 * | 9/2002 | Hargreaves et al. | 324/300 |

OTHER PUBLICATIONS

Baum, J. et al. "Broadband Population Inversion by Phase Modulated Pulses". J. Chem. Phys. (1983), vol. 79, pp. 4643–4644.

Bradford, R. et al. "A Steady–State Transient Technique in Nuclear Induction". Phys. Rev. 84 (1951), pp. 157–158.

Carr, H.Y. "Steady–State Free Precession in Nuclear Magnetic Resonance". Phys. Rev. (1958), pp. 1693–1701.

Ernst, R. R. et al. "Principles of Nuclear Magnetic Resonance in One and Two Dimensions". Clarendon Press (1987).

Freed, D. E. et al. "Steady–State Free Precession Experiments and Exact Treatment of Diffusion in a Uniform Gradient". J. Chem. Phys. (2001), vol. 115, No. 9, pp. 4249–4258.

Freeman, R. et al. "Phase and Intensity Anomalies in Fourier Transform NMR". J. Magnetic Resonance, vol. 4 (1971), pp. 366–383.

Hurlimann, M. D. "Carr–Purcell Sequences with Composite Pulses". J. Mag. Res. (2001), vol. 152, pp. 109–123.

Kleinberg, R. L. "Encyclopedia of Nuclear Magnetic Resonance" (1996), vol. 8, Chapter Well Logging, pp. 4960–4969.

Merboldt, K. D. et al. "Rapid NMR Imaging of Molecular Self–Diffusion Using a Modified CE–FAST Sequence". J. Magnetic Resonance (1989), vol. 82, pp. 115–121.

Zur, Y. et al. "An Analysis of Fast Imaging Sequences with Steady–State Transverse Magnetization Refocusing". Magnetic Resonance Med. (1988), pp. 175–193.

* cited by examiner

*Primary Examiner*—Louis Arana
(74) *Attorney, Agent, or Firm*—Jody Lynn DeStefanis; William B. Batzer; John J. Ryberg

(57) ABSTRACT

Nuclear magnetic resonance logging methods that detect and analyze a steady state free precession (SSFP) signal are described. In some embodiments, Carr-Purcell-Meiboom-Gill (CPMG) spin echoes are detected along with the SSFP signals. From the SSFP signal, either alone or in combination with CPMG signals, information about a region of an earth formation, such as porosity, bound fluid volume and diffusion, may be extracted.

37 Claims, 8 Drawing Sheets

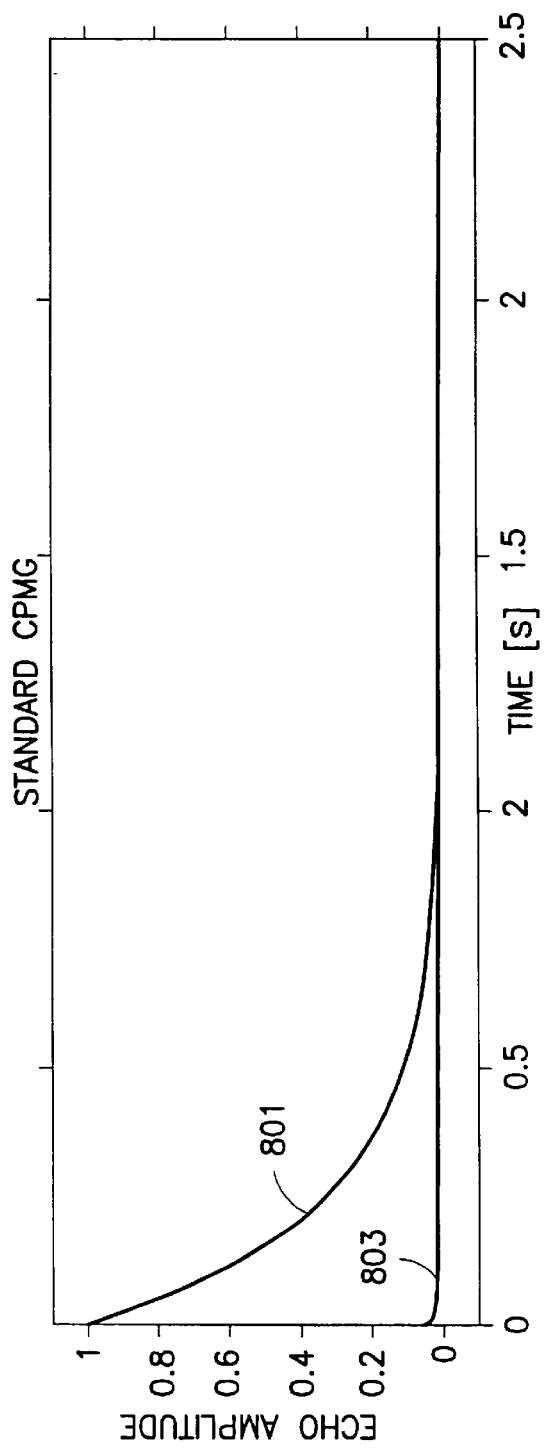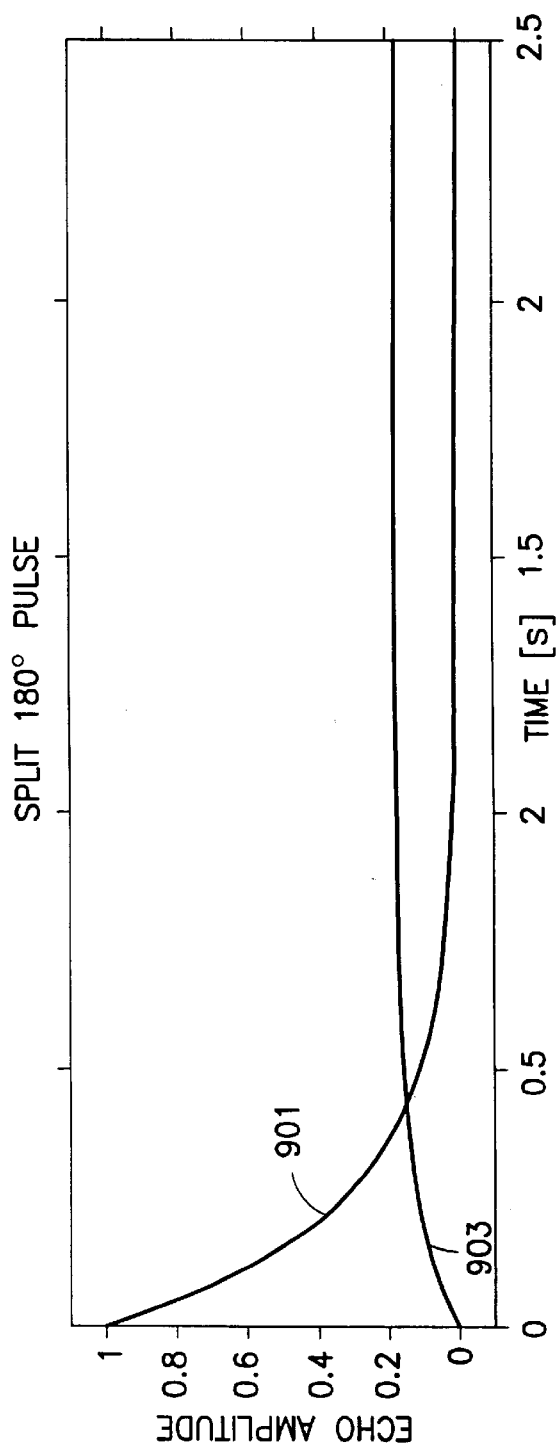

NUCLEAR MAGNETIC RESONANCE LOGGING BASED ON STEADY-STATE FREE PRECESSION

FIELD OF THE INVENTION

This invention relates to investigations of earth formations, and more particularly elates to nuclear magnetic resonance (NMR) logging of earth formations.

BACKGROUND

NMR has been a common laboratory technique for over forty years and has become an important tool in formation evaluation. General background of NMR well logging can be found, for example, in U.S. Pat. No. 5,023,551 to Kleinberg et al., which is assigned to the same assignee as the present invention and herein incorporated by reference in its entirety.

NMR relies upon the fact that the nuclei of many chemical elements have angular momentum ("spin") and a magnetic moment. In an externally applied static magnetic field, the spins of nuclei align themselves along the direction of the static field. This equilibrium situation can be disturbed by a pulse of an oscillating magnetic field (e.g., an RF pulse) that tips the spins away from the static field direction. The angle through which the spins are tipped is given by $\theta = \gamma B_1 t_p/2$, where $\gamma$ is the gyromagnetic ratio, $B_1$ is the linearly polarized oscillating field strength, and $t_p$ is the duration of the pulse. Tipping pulses of ninety and one hundred eighty degrees are most common.

After tipping, two things occur simultaneously. First, the spins precess around the direction of the static field at the Larmor frequency, given by $\omega_0 = \gamma B_0$, where $B_0$ is the strength of the static field and $\gamma$ is the gyromagnetic ratio. For hydrogen nuclei, $\gamma/2\pi = 4258$ Hz/Gauss, so, for example, in a static field of 235 Gauss, the hydrogen spins would precess at a frequency of 1 MHz. Second, the spins return to the equilibrium direction according to a decay time, $T_1$, which is known as the spin-lattice relaxation time. Because this spin-lattice relaxation occurs along the equilibrium direction, $T_1$ is also referred to as the longitudinal relaxation time constant.

Also associated with the spin of molecular nuclei is a second relaxation time, $T_2$, called the spin-spin relaxation time. At the end of a ninety-degree tipping pulse, all the spins are pointed in a common direction perpendicular, or transverse, to the static field, and they all precess at the Larmor frequency. However, because of small fluctuations in the static field induced by other spins or paramagnetic impurities, the spins precess at slightly different frequencies, and the transverse magnetization dephases with a time constant $T_2$, which is also referred to as the transverse relaxation time constant.

A standard technique for measuring $T_2$, both in the laboratory and in well logging, uses an RF pulse sequence known as the CPMG (Carr-Purcell-Meiboom-Gill) sequence. As is well known, after a wait time that precedes each pulse sequence, an initial pulse tips the spins into the transverse plane and causes the spins to start precessing. Then, a one hundred eighty-degree pulse is applied that keeps the spins in the measurement plane, but causes the spins, which are dephasing in the transverse plane, to reverse direction and to refocus. By repeatedly reversing the spins using a series of one hundred eighty degree pulses, a series of "spin echoes" appear. The train of echoes is measured and processed to determine the irreversible dephasing time constant, $T_2$. In well logging applications, the detected spin echoes have been used to extract oilfield parameters such as porosity, pore size distribution, and oil viscosity.

SUMMARY OF INVENTION

The invention acquires and analyzes a different type of magnetic resonance signal than is typically detected and analyzed in current nuclear magnetic resonance well logging methods. In some embodiments, this other signal is generated, acquired and analyzed along with the spin echoes that are generated in nuclear magnetic resonance logging methods based on the CPMG sequence. This other signal has been recognized by the inventors to be a steady state free precession (SSFP) signal. Thus, according to the invention, a method of evaluating an earth formation includes introducing a nuclear magnetic resonance logging tool into a borehole that traverses the earth formation to apply a sequence of magnetic pulses to a region of investigation within the earth formation. The nuclear magnetic resonance tool detects a SSFP signal from the region, and the SSFP signal is analyzed to extract information about the region of investigation.

Further details and features of the invention will become more readily apparent from the detailed description that follows.

BRIEF DESCRIPTION OF FIGURES

The invention will be described in more detail below in conjunction with the following Figures, in which:

FIG. 12 contains a graph of the integrated CPMG and SSFP signals (using appropriately matched filters) as a function of time that a standard CPMG sequence is applied; and FIG. 13 contains a graph showing the integrated CPMG and SSFP signals (using appropriately matched filters) as a function of time that a split 180-degree CPMG sequence is applied.

DETAILED DESCRIPTION

In the presence of a static magnetic field, the periodic application of a phase coherent oscillating magnetic field (RF) pulse, or a set or composite of such magnetic pulses, will prepare a system of nuclear spins in a dynamic equilibrium; the resulting state shall be referred to herein as a "steady-state free precession" (SSFP). Each magnetic pulse causes the spins to rotate by some angle, and, afterwards, the spins relax back towards thermal equilibrium, with the net magnetization of the system growing along the positive longitudinal direction while shrinking in the transverse plane. As the (sets or composites of) magnetic pulses are repeatedly applied, the net magnetization of the system eventually reaches a driven equilibrium state where the net magnetization present at the start of a repeating unit is identical to the net magnetization at the end of the repeating unit. In this driven equilibrium state, the net amount that the magnetization decays is balanced by the net amount that it grows over the repeating unit, and spins in the transverse plane acquire phases that create a periodic steady-state free precession (SSFP) signal.

Figure 1:
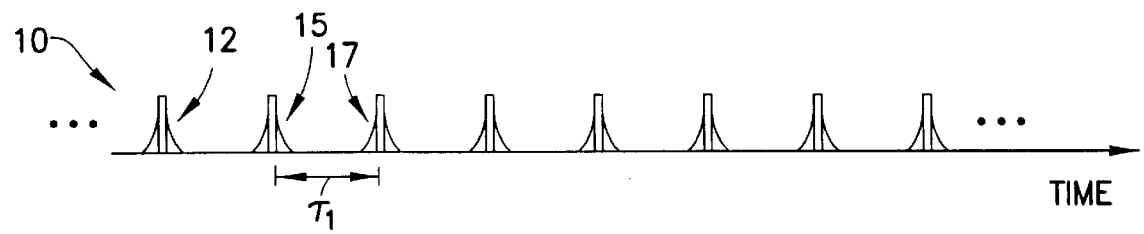
FIG. 1 illustrates a generic steady state free precession (SSFP) sequence.

FIG. 1 illustrates a generic SSFP pulse sequence 10 in which a magnetic pulse 12, which rotates the spins by an angle θ, is periodically applied to a system of spins with a period ($\tau_1$) as shown. The angle θ may be any value, though θ≈180-degrees presents a special case (which will be discussed below). The magnetic pulse 12 may be an individual magnetic pulse, or made up of a set or composite of magnetic pulses that result in a net θ-degree rotation of the spins. The period ($\tau_1$) between magnetic pulses typically, though not necessarily, is much shorter than both longitudinal and transverse relaxation time constants of the system of spins, i.e., $\tau_1 \ll T_1$ and $T_2$.

Each pulse 12 excites the spins, causing a free-induction decay (FID) 15 immediately after the pulse. Just before the next pulse, the spins begin to refocus, forming a SSFP echo that is approximately centered inside the next pulse. In reasonably homogeneous fields, the SSFP echo is typically longer than the width of the magnetic pulse and is observable immediately preceding the next pulse (see 17). Both the after-pulse FID 15 and the pre-pulse echo 17 provide a measurable SSFP signal. In inhomogeneous fields, such as typically found in NMR tools, the pulse width and the SSFP signal may be comparable, making much of the SSFP signal difficult to observe.

Figure 2:
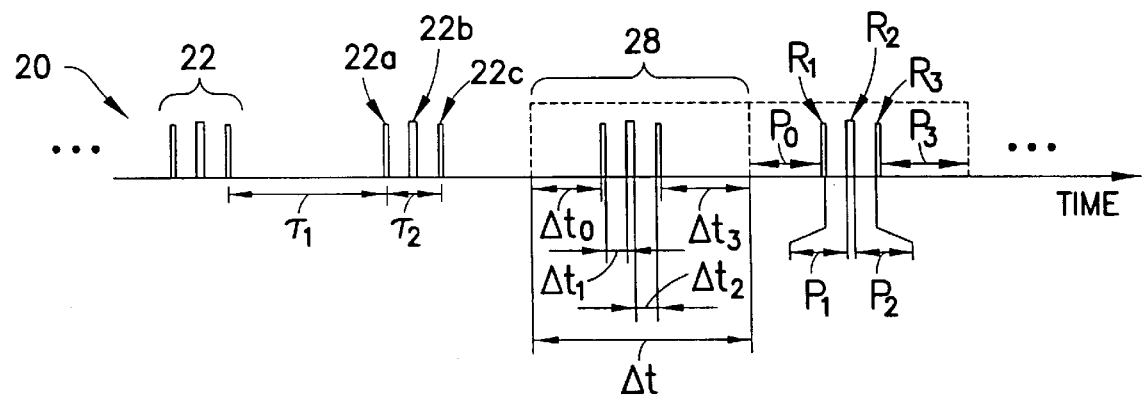
FIG. 2 shows one embodiment of a SSFP sequence.

As mentioned previously, the periodically repeating magnetic pulse in a SSFP sequence may be an individual magnetic pulse, a composite magnetic pulse, or made up of a set of magnetic pulses. FIG. 2 illustrates one embodiment of a SSFP sequence 20 made up of a periodically repeating set of magnetic pulses 22 with a period ($\tau_1$) as shown. Each set of magnetic pulses 22 includes three magnetic pulses 22a, 22b, 22c and has an overall width ($\tau_2$) as shown. The period ($\tau_1$) and width ($\tau_2$) of the set of magnetic pulses are typically much smaller than $T_1$ and $T_2$, i.e., $\tau_1 \ll T_1$, $T_2$ and $\tau_1 \ll T_1$, $T_2$. Although FIG. 2 shows each set 22 as being made up of three magnetic pulses, the repeating set of magnetic pulses may include any number of magnetic pulses. A set that, when applied repeatedly, produces a large steady-state magnetization, and so provides a large SSFP signal, is preferred. One example of such a SSFP sequence is a driven equilibrium Fourier transform (DEFT) sequence, which is made up of a set of magnetic pulses as follows:

$$90_x - t - [180_y - 2t]_i - 180_y - t - 90_{-x}$$

where t is a time interval that separates the magnetic pulses and i is an integer ≦0.

A SSFP sequence also may be thought of as a series of repeating units 28 of rotations ($R_j$) due to the magnetic pulses and free-precessions ($P_j$) that occur during the time intervals ($\Delta t_j$) between magnetic pulses, with each repeating unit having an overall width of $\Delta t$, as shown in FIG. 2. With this picture of a SSFP sequence in mind, the net magnetization just before the repeating unit in a rapid pulsing limit (i.e., $\tau_1 \ll T_1$, $T_2$) is given by:

$$M(t) = M_t(t) + M_{ss}, \quad (1)$$

where $M_t(t)$ is the transient part and $M_{ss}$ is the steady state part of the SSFP signal which, for grossly inhomogeneous fields or θ≈2πn (for any integer n), are given by:

$$M_t(t) = e^{-t/T_{eff}} \left( \hat{n} \cdot \vec{m}_0 - \frac{T_{eff}}{T_1} M_0 \hat{n} \cdot \vec{p} \right) \hat{n} \quad (2)$$

$$M_{ss} = M_0 \frac{T_{eff}}{T_1} (\hat{n} \cdot \vec{p}) \hat{n} \quad (3)$$

where $T_{eff}$ is an effective relaxation time that averages the longitudinal relaxation rate and the transverse relaxation rate, $\hat{n}$ is the axis of rotation for the full rotation of a repeating unit 28 (i.e., the rotations due to the magnetic pulses and free-precessions in one repeating unit), $\vec{m}_0$ is the initial magnetization of the system, $M_0$ is the (thermal) equilibrium magnetization, and $\vec{p}$ is proportional to the net relaxation to the equilibrium magnetization during a repeating unit 28. The vector $\vec{p}$ is given by:

$$\vec{p} = \sum_{j=0}^{k} \left( \prod_{i=j+1}^{k} P_i R_i \right) a_j \hat{z} \quad (4)$$

where $\alpha_j = \Delta t_j / \Delta t$. The effective relaxation time, $T_{eff}$, governs both the approach of the magnetization to steady state and the final steady state value of the magnetization, and is given by:

$$\frac{1}{T_{eff}} = \frac{1}{T_2} (\langle (\hat{x} \cdot \hat{n})^2 \rangle + \langle (\hat{y} \cdot \hat{n})^2 \rangle) + \frac{1}{T_1} \langle (\hat{z} \cdot \hat{n})^2 \rangle \quad (5)$$

$$= \frac{1}{T_2} \sum_{j=0}^{k} a_j \left[ \left( \hat{x} \cdot \prod_{i=1}^{j} (P_i R_i) P_0 \hat{n} \right)^2 + \left( \hat{y} \cdot \prod_{i=1}^{j} (P_i R_i) P_0 \hat{n} \right)^2 \right] + \frac{1}{T_1} \sum_{j=0}^{k} a_j \left( \hat{z} \cdot \prod_{i=1}^{j} (P_i R_i) P_0 \hat{n} \right)^2$$

The quantities $R_j$, $P_j$, $\Delta t_j$, and $\Delta t$ are as defined above and shown in FIG. 2. Substituting (5) into (2) and (3), respectively, and rearranging the terms slightly, provides:

$$M_t(t) \propto \exp\left\{ -\frac{At}{T_2} - \frac{Bt}{T_1} \right\} \quad (6)$$

$$M_{ss} = \frac{M_0}{A + B(T_1/T_2)} (\hat{n} \cdot \vec{p}) \hat{n} \quad (7)$$

where $$A = \sum_{j=0}^{k} a_j \left[ \left( \hat{x} \cdot \prod_{i=1}^{j} (P_i R_i) P_0 \hat{n} \right)^2 + \left( \hat{y} \cdot \prod_{i=1}^{j} (P_i R_i) P_0 \hat{n} \right)^2 \right] \text{ and}$$

-continued $$B = \sum_{j=0}^{k} a_j \left( \hat{z} \cdot \prod_{i=1}^{j} (P_i R_i) P_0 \hat{n} \right)^2.$$

and

From (6), it can be seen that, for any SSFP sequence, the transient SSFP amplitude will decay as the magnetization approaches steady state with a time constant that depends on both $T_1$ and $T_2$. Equation (7) shows that for any SSFP sequence, the steady state magnetization depends on $T_1$ and $T_2$ only through the ratio of $T_1/T_2$. Thus, equations (6) and (7) demonstrate that any SSFP sequence can be used to extract information about $T_1$ and $T_2$ as well as to measure the ratio $T_1/T_2$.

Figure 3:
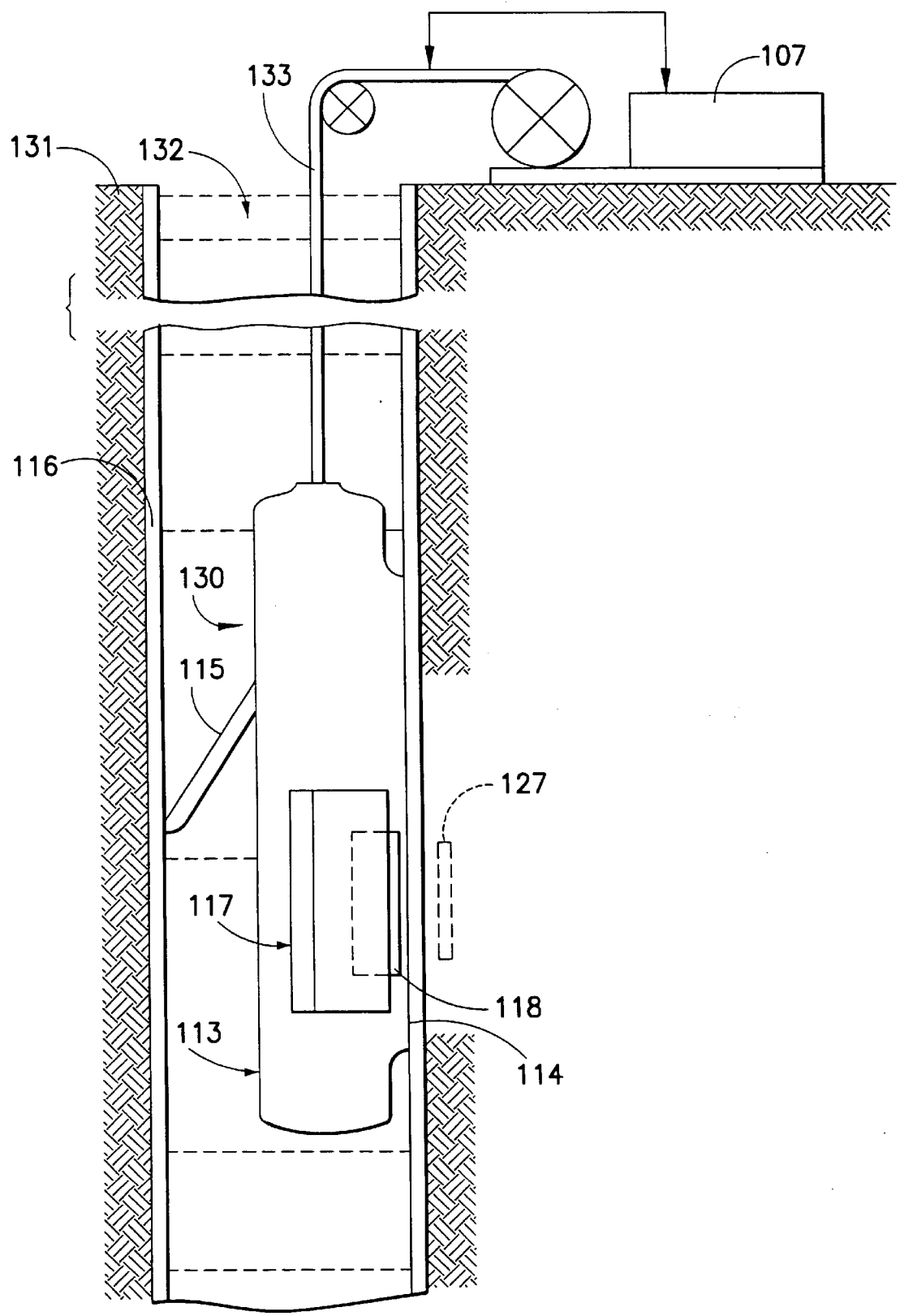
FIG. 3 illustrates one embodiment of a nuclear magnetic resonance (NMR) logging apparatus that may be used to implement the methods of the invention.

A SSFP sequence may be implemented in well logging using a nuclear magnetic resonance (NMR) well logging apparatus, such as the embodiment shown in FIG. 3. A NMR investigating apparatus or logging device 130 is suspended in the borehole 132 on an armored cable 133, the length of which substantially determines the relative depth of the device 130. The length of cable 133 is controlled by suitable means at the surface such as a drum and winch mechanism. Surface equipment, represented at 107, can be of conventional type, and can include a processor subsystem that communicates with all the downhole equipment. It will be understood that some of the processing can be performed downhole and that, in some cases, some of the processing may be performed at a remote location. Also, while a wireline is illustrated, alternative forms of physical support and communicating link can be used, for example in a measurement-while-drilling or logging-while-drilling system, in practicing the methods of the invention. Accordingly, the terms "logging apparatus" and "logging" as used herein encompass all such apparatuses and measurements made using such apparatuses.

As described, for example, in U.S. Pat. Nos. 5,055,787, 5,055,788, and 5,153,514, the NMR logging device 130 can have a face 114 to intimately contact the borehole wall. The borehole wall may have a mudcake 116 thereon. A retractable arm 115 is provided which can be activated to press the body of the tool 113 through the mudcake against the borehole wall during a logging run, with the face 114 pressed against the wall's surface. Although the tool 113 is shown as a single body, the tool may alternatively include separate components such as a cartridge, sonde or skid, and the tool may be combinable with other logging tools.

The logging device includes, for example, a permanent magnet or permanent magnet array 117, which may be made of a samarium-cobalt-magnetic material, and one or more RF antennas 118. The investigation region, or sensitivity zone, represented generally at 127, is a region in the formation in which the static magnetic field is generally uniform, although this is not required and for some embodiments not preferred, for operation in accordance with the invention. It will be understood that other suitable tool configurations, such as a configuration in which the logging tool is approximately centered within the borehole and generates a static magnetic field in a region of investigation that surrounds the circumference of the borehole, can be utilized for practicing the invention.

Figure 4:
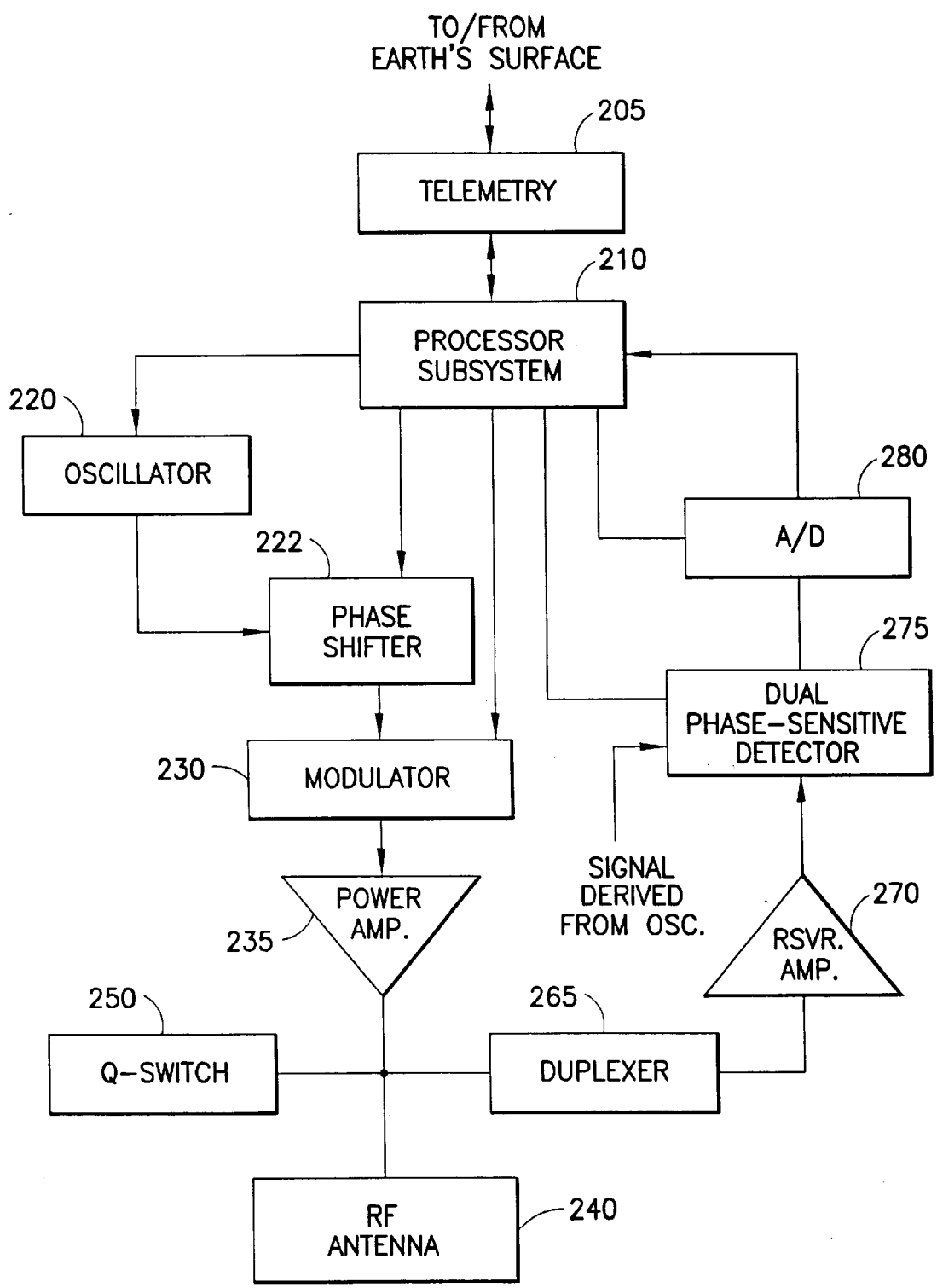
FIG. 4 schematically illustrates one embodiment of a circuit that may be used to implement the methods of the invention.

FIG. 4 shows, in simplified form, circuitry of a type that can be used for producing RF pulse sequences and for receiving and processing magnetic resonance signals. It will be appreciated, however, that circuitry having different configurations may be used for practicing the invention.

A downhole processor subsystem is represented at 210. The processor subsystem 210 has associated memory, timing, interfaces, and peripherals (not separately shown), as is known in the art. The processor subsystem is conventionally coupled with telemetry circuitry 205, for communication with the earth's surface. It should be noted that the processor subsystem and associated components may reside downhole, uphole, or partially downhole and partially uphole An oscillator 220 produces radio frequency (RF) signals at the desired resonant frequency or frequencies in the investigation region, and the output of the oscillator is coupled to a phase shifter 222 and then to a modulator 230, both of which are under control of the processor subsystem 210. The phase shifter and modulator can be controlled, in a manner known in the art, to produce the desired pulses of RF field that make up a SSFP sequence. As described, for example, in U.S. Pat. No. 5,055,788, the oscillator 220 can be a plurality of oscillators used in a manner that facilitates the generation and ultimate detection of the desired signals. The output of modulator 230 is coupled, via a power amplifier 235, to the RF antenna 240. A Q-switch 250 can be provided to critically dampen the RF antenna system to reduce antenna ringing.

The antenna 240 is also coupled with a receiver section via duplexer 265, the output of which is coupled to receiver amplifier 270. The duplexer 265 protects the receiver during the transmitting and damping modes. During the receiving mode, the duplexer 265 is effectively just a low impedance connection from the antenna to the receiver amplifier 270. The output of the receiver amplifier 270 is coupled to a dual phase-sensitive detector 275, which also receives, as a reference, a signal derived from the oscillator signal. The detected output is coupled to analog-to-digital converter 280, the output of which is a digital version of the received nuclear magnetic resonance signal.

As currently implemented, NMR well logging often involves applying a CPMG sequence to a region of investigation within an earth formation and analyzing CPMG spin echoes detected from the region to measure $T_2$ and extract information about the region such as formation porosity, pore size distribution, and fluid viscosity. In reasonably uniform magnetic fields, a CPMG sequence, or any periodic series of identical 180-degree pulses, would produce no observable SSFP signal because a 180-degree pulse keeps the spins in the same plane and does not shift magnetization between the longitudinal axis and the transverse plane as required to establish a SSFP magnetization. For example, with a system that starts in thermal equilibrium, a series of 180-degree pulses keeps the spins along the longitudinal axis. In the case of a CPMG sequence, in which a pulse that tips the spins into the transverse plane typically precedes the series of 180-degree pulses, the 180-degree pulses keep the spins in the transverse plane. In inhomogeneous magnetic fields, however, some of the nuclear spins will be off resonance, so a periodic series of 180-degree pulses will not keep all of the spins always along the longitudinal axis or always in the transverse plane. The magnetic fields generated in the earth formations in nuclear magnetic resonance logging typically are inhomogeneous, so NMR logging using a CPMG sequence typically will produce a SSFP signal in addition to CPMG spin echoes.

Figure 5:
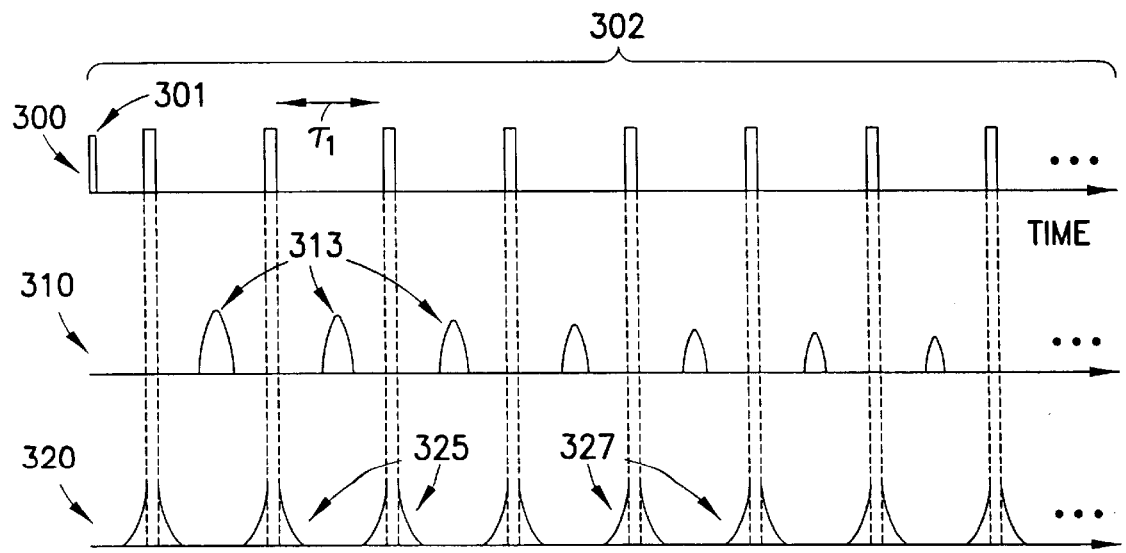
FIG. 5 illustrates one embodiment of a NMR well logging method according to the invention.

FIG. 5 illustrates how CPMG and SSFP signals are generated with a CPMG sequence (using inhomogeneous fields). A CPMG pulse sequence 300 includes an initial pulse 301 that tips the spins into the transverse (measurement) plane followed by a series of 180-degree pulses 302. The series of 180-degree pulses is made up of a 180-degree pulse that is periodically repeated with a period ($\tau_1$) as shown. CPMG echoes 313 that are generated using the CPMG sequence 300 are shown at 310. The dashed vertical lines show where the 180-degree pulses occur relative to the spin echoes. As is well known to those of ordinary skill in the art, the amplitude of the CPMG echoes decays exponentially to zero (or to the noise limit of the detector) with a time constant $T_2$. SSFP signals generated by the CPMG sequence 300 are shown at 320. As discussed above, a FID 325 appears immediately after each 180-degree pulse, and a pre-pulse portion of the SSFP echo 327, which is approximately centered within the next pulse, typically is observable.

In a typical NMR well logging run, the CPMG sequence is applied several times to a region of investigation within the earth formation, and the signals detected from each CPMG sequence are combined to build up signal-to-noise. The CPMG data typically are phase cycled to remove electronic offsets and tool ringing. Phase cycling involves reversing the phase of the initial pulse (relative to the 180-degree pulses) in successive CPMG runs, and subtracting the data acquired from two successive runs. Reversing the phase of the initial pulse causes the phase of the CPMG echoes to also reverse, so subtracting two successive runs will add up the CPMG signal while subtracting out electronic offsets and pulse ringing.

The SSFP signal currently is not acquired or analyzed in CPMG well logging for at least two reasons. First, the phase cycling discussed above that builds up CPMG signal-to-noise subtracts out the SSFP signals, whose phase does not change when the phase of the initial pulse is reversed, along with subtracting out electronic noise and pulse ringing. The SSFP signal may be observed by adding (odd phase cycling), instead of subtracting (even phase cycling), successive data acquisition runs. Adding successive acquisition runs, however, will not remove the electronic offset noise from the SSFP signal. Phase cycling that involves switching the phase of the 180-degree pulses and subtracting successive data acquisition runs also may be used to reduce the electronic offsets while enhancing the SSFP signal-to-noise.

A second reason that the SSFP signal currently is not acquired or analyzed in CPMG logging relates to the setting of the detection electronics. The detection window during which the A/D converter is turned on is typically set in a region midway between 180-degree pulses, where the CPMG spin echo occurs, and the detection electronics typically turned off after the CPMG sequence has been applied. Focusing the detection window in the region midway between 180-degree pulses and turning off the detector after the end of the CPMG sequence help reduce the amount of noise that is detected in a CPMG run, but it also blinds the detector to the SSFP signal. As discussed above, the SSFP echo occurs substantially coincident with the 180-degree pulses (as illustrated by the dashed vertical lines in FIG. 5), though at least the pre-pulse echo 327 typically remains observable. Also, after the last 180-degree pulse of the CPMG sequence, a final SSFP echo appears unobstructed by a subsequent 180-degree pulse. Thus, changing the detection window to include at least the pre-pulse echo 327 and leaving the detection electronics on long enough to capture the final SSFP echo, in combination with the proper phase cycling as discussed above, allows the SSFP signal to be acquired and analyzed in CPMG well logging.

Figure 6:
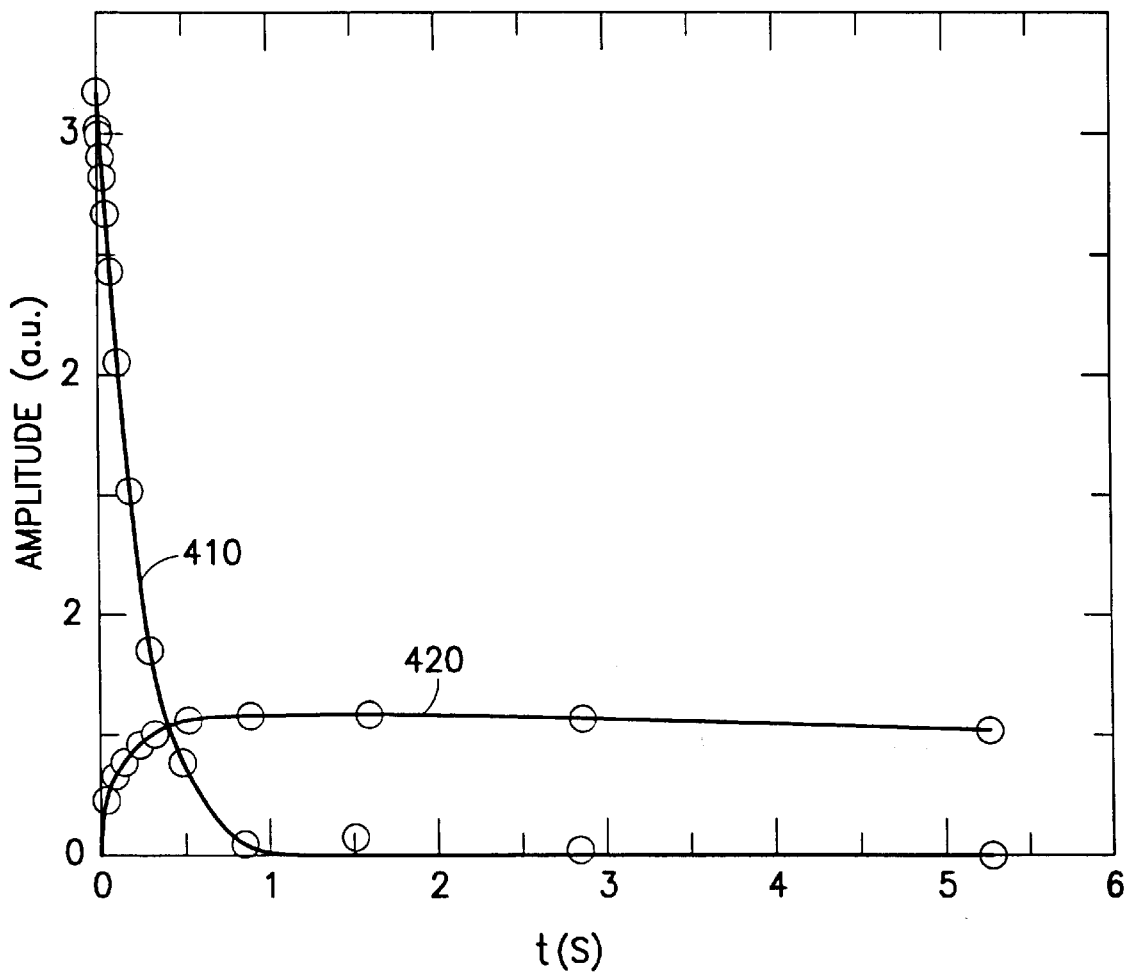
FIG. 6 shows a graph of a CPMG signal and a SSFP signal over time.

FIG. 6 illustrates the transient behavior of CPMG and SSFP signals generated using a CPMG sequence. The data illustrated in FIG. 6 were generated by applying a standard CPMG sequence to a doped water sample ($T_2$=210 ms). Each data point represents the echo amplitude and is plotted as a function of the sequence length (i.e., the time, t, the CPMG sequence is applied). The curve 410 exponentially fit through the CPMG data points ($T_2$=204±4 ms) shows the CPMG signal initially having a relatively large amplitude and decaying to zero over time. In contrast, the curve 420 exponentially fit through the SSFP data points ($T_{SSFP}$=220±10 ms; at low fields in bulk fluids, $T_{SSFP}$=$T_1$=$T_2$) shows the SSFP signal initially having a relatively small amplitude and growing to a finite, steady state value.

In general, sharpening the magnetic (RF) pulses and reducing the hardware delays will improve the SSFP signal. Also, using pulses that result in a net rotation slightly greater or less than 180-degrees and/or that are slightly shifted off the nominal rotation axis should increase the SSFP signal and, if not too far off, not sizably detract from the CPMG signal; such pulses shall hereinafter be referred to as "off-resonance pulses".

Figure 7:
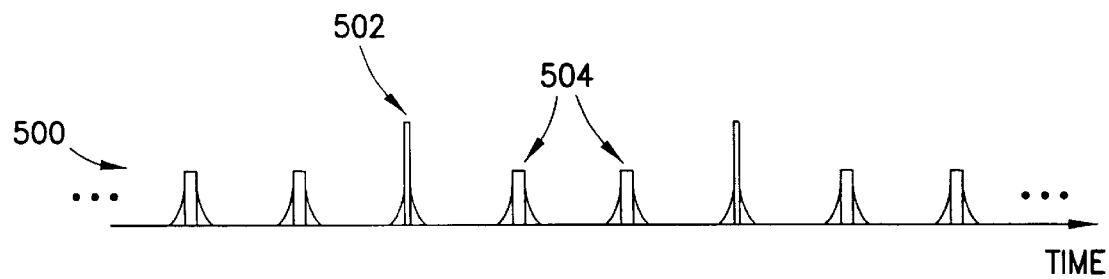
FIG. 7 illustrates one embodiment of a modified CPMG sequence in accordance with the invention.
Figure 8:
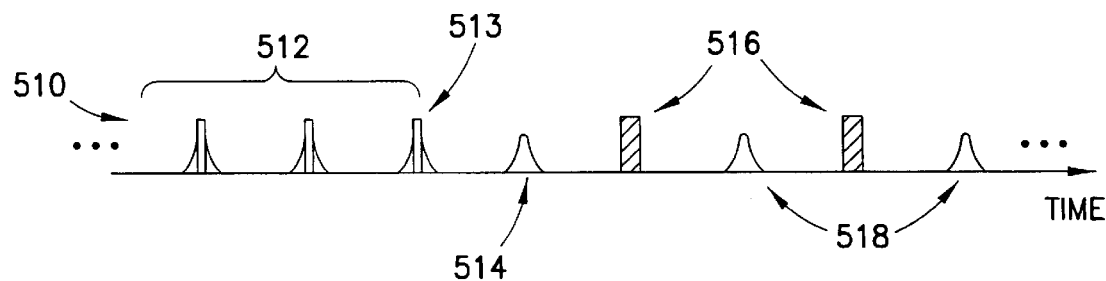
FIG. 8 illustrates another embodiment of a modified CPMG sequence in accordance with the invention.
Figure 9:
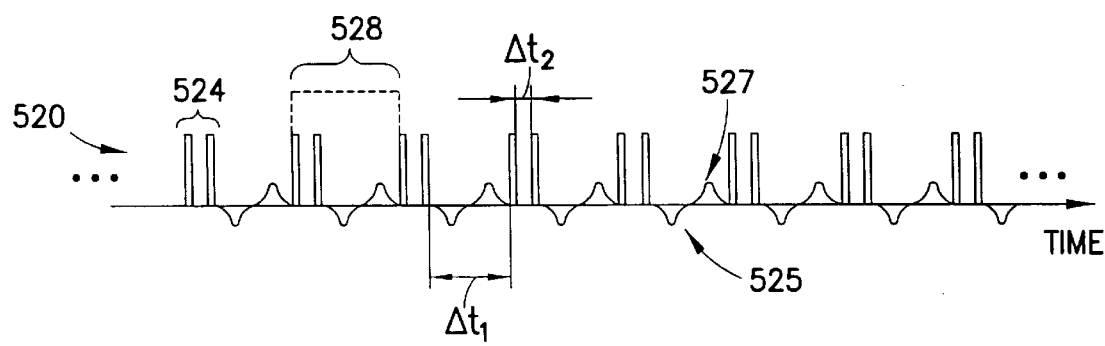
FIG. 9 illustrates still another embodiment of a modified CPMG sequence according to the invention.

FIGS. 7–9 illustrate several modifications to a CPMG sequence that also may be employed when implementing simultaneous CPMG and SSFP measurements in NMR well logging to increase the size of the observable SSFP signal. For the sake of clarity and convenience, FIGS. 7–9 show only the SSFP signal that would be generated using these modified sequences; it is to be understood that the CPMG signal, though not shown, would also be generated using these modified sequences.

One modification involves periodically varying the width of one or more 180-degree pulses of a standard CPMG sequence. For example, in the series of 180-degree pulses 500 shown in FIG. 7, every third 180-degree pulse 502 is narrower than the other 180-degree pulses 504. The narrower pulse 502 allows more of the pre-pulse echo to be observed, increasing the measurable SSFP signal. This modification may be implemented in a variety of ways, using any of number of 180-degree pulses having differing widths.

Another technique for increasing the measurable SSFP signal is to apply a series of refocusing pulses designed to refocus the final SSFP echo after the standard CPMG sequence, as shown in FIG. 8 at 510. A series of 180-degree pulses 512 of a standard CPMG sequence prepares the system of spins in a steady-state free precession. After the last 180-degree pulse 513 of the CPMG sequence, a SSFP echo 514 appears, unobstructed by a subsequent 180-degree pulse. This SSFP echo 514 may be refocused using one or more refocusing pulses 516 designed to generate a series of SSFP echoes 518 in a similar manner in which the 180-degree pulses of a CPMG sequence generate a series of CPMG spin echoes. The refocusing pulse typically will be a composite pulse designed to refocus the off resonance spins that make up the SSFP signal. A composite pulse may be based on adiabatic fast passages, such as described, for example, in J. Baum, et al., "Broadband Population Inversion by Phase Modulated Pulses," J. Chem. Phys., vol. 79, pp. 4643–4644 (1983), or hard RF pulses. In one embodiment, a composite pulse may be designed by matching the net transverse magnetization of the SSFP signal with an axis that characterizes the overall rotation of the refocusing cycle, including the rotation due to the free precession following an echo, rotation due to the composite refocusing pulse, and rotation due to the free precession leading up to the next echo. For example, a composite of a $90\sqrt{2}_{+x}$-degree pulse and a $90\sqrt{2}_{-x}$-degree pulse has a net rotation axis in the yz-plane and can refocus spins that are off resonance by a frequency of $\Delta\omega_0 \approx \pm \omega_{1,0}$ where $\omega_{1,0}$ is the nominal rf field strength. Composite pulses are described more fully in M. D. Hürlimann, "Carr-Purcell Sequences with Composite Pulses," J. Mag. Res., vol. 152, pp. 109–123 (2001). Those of skill in the art will be able to design other composite pulses to refocus other off resonance spins.

Still another technique to increase the measurable SSFP signal during a CPMG sequence is illustrated in FIG. 9. This technique involves splitting a 180-degree pulse into a plurality of pulses that together act much like a 180-degree pulse. FIG. 9 illustrates one embodiment of a "split 180-degree" pulse with a modified CPMG sequence 520 having a series of paired 90-degree pulses 524 that essentially act like a single 180-degree pulse. Alternatively, the sequence 520 may be viewed as a SSFP sequence in which the repeating unit 528 is made up of 90-degree pulses separated by alternating time intervals, $\Delta t_1$ and $\Delta t_2$, as shown. Varying the successive time intervals in this sequence 520 has the effect of splitting up and moving some of the after-pulse FID 525 and pre-pulse echo 527 away from the applied RF pulses. By adjusting the ratio of the time intervals, $\Delta t_2/\Delta t_1$, some of the SSFP signals may be moved far enough away from the pulses to avoid the dead time and hardware delays that would otherwise obscure the SSFP signal.

FIGS. 10A–B and 11A–B show how splitting the 180-degree pulse into two 90-degree pulses affects the initial and longer time phased CPMG and the SSFP signals in a 600 μs time interval that follows each (split) 180-degree pulse. Because of the dead time of the receiver and interference by the magnetic pulses, data was not acquired over the entire time interval. Data acquisition was started approximately 100 μs after the (split) 180-degree pulse and ended approximately 50 μs before the next (split) 180-degree pulse.

Figure 10B:
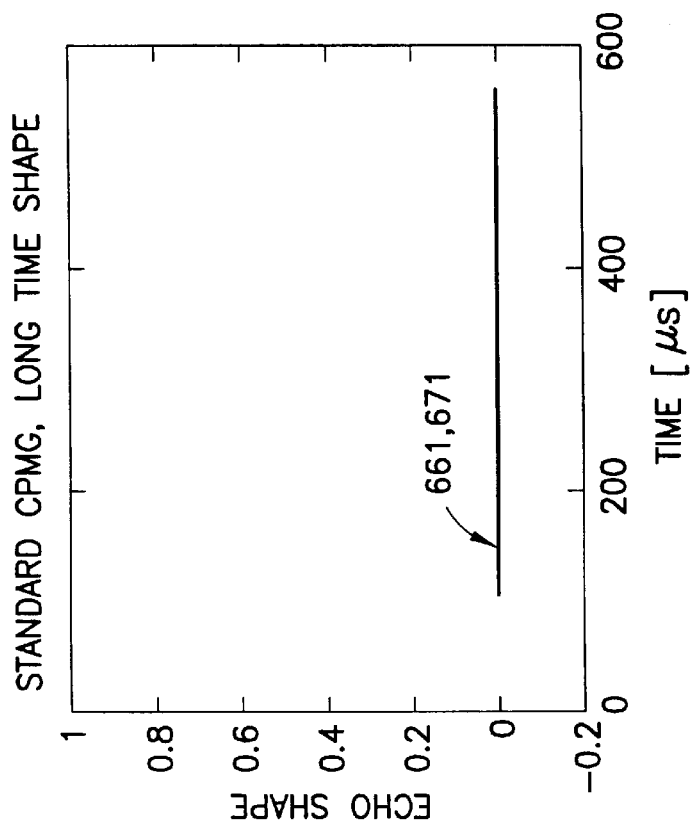
FIGS. 10A and 10B contain graphs showing the initial and long time, respectively, CPMG and SSFP signals generated by a standard CPMG sequence.
Figure 10A:
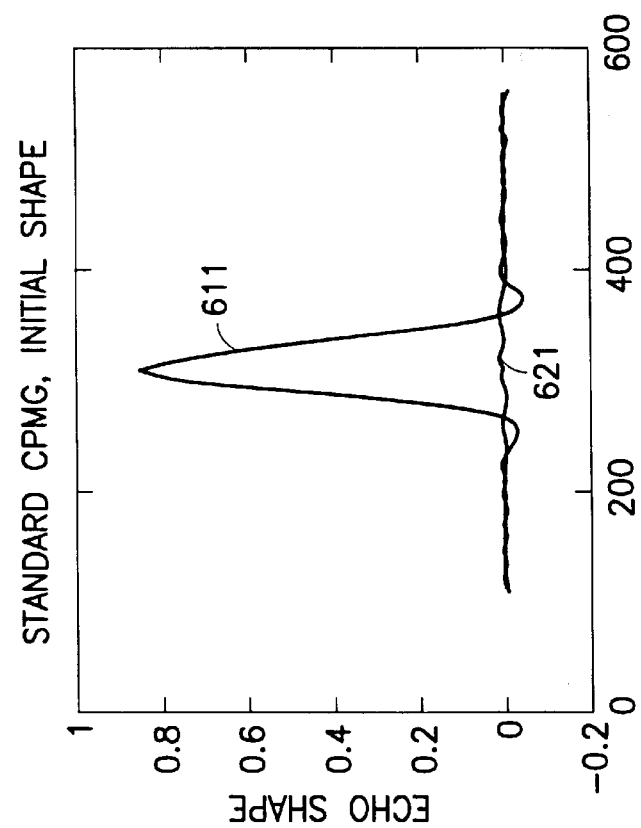

FIG. 10A shows the initial phased CPMG and SSFP signals generated by a standard CPMG sequence (as shown in FIG. 5 at 300, $\tau_1$=600 μs). An initial CPMG signal 611 appears approximately midway through the time interval, at t≈300 μs, as would be expected. Essentially no SSFP signal 621 is observed during this initial time frame. FIG. 10B shows the CPMG and SSFP signals at a longer time. The phased data overlap substantially, but essentially no CPMG or SSFP signal is observed. The CPMG signal is expected to decay over time, so the absence of the CPMG signal is expected. The SSFP signal, on the other hand, is expected to grow over time, but essentially no SSFP signal is seen due to the dead time of the receiver and interference by the 180-degree pulses.

Figure 11B:
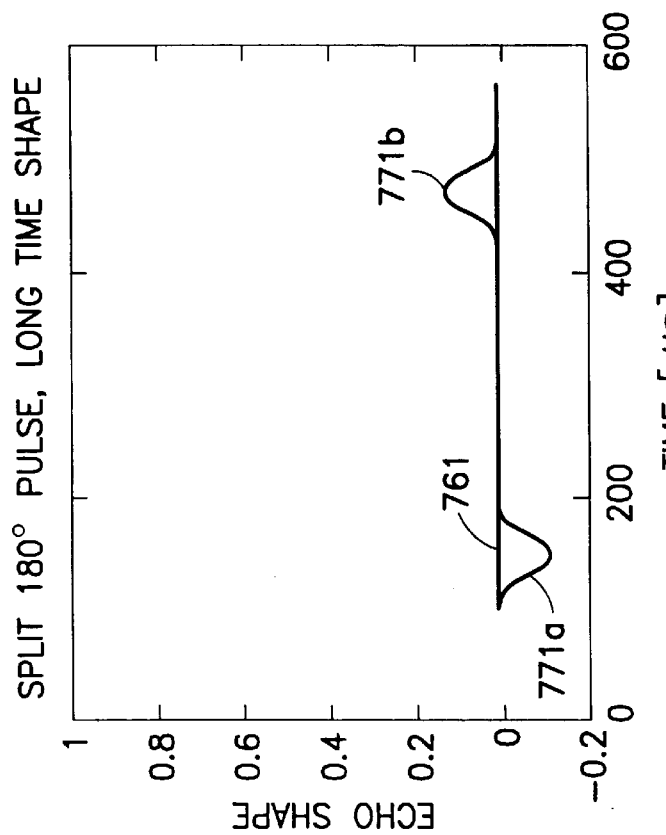
FIGS. 11A and 11B contain graphs showing the initial and long time, respectively, CPMG and SSFP signals generated by a split 180-degree CPMG sequence.
Figure 11A:
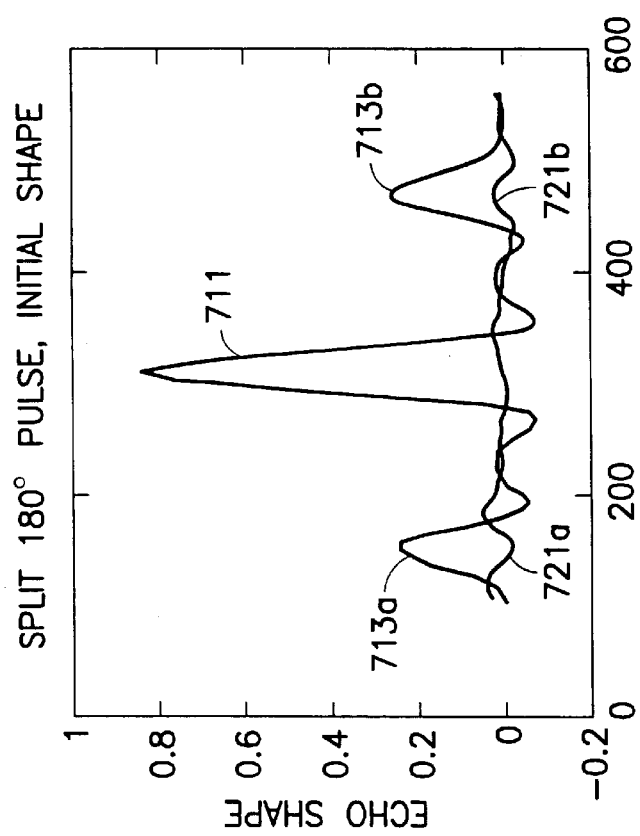

FIGS. 11A and 11B show the initial and later time, respectively, phased CPMG and SSFP signals generated by a split 180-degree CPMG sequence (as shown in FIG. 9 at 520, $\Delta t_1$=600 μs and $\Delta t_2$=150 μs). An initial CPMG signal 711 is still observed at t≈300 μs. The shape of this CPMG echo, however, has changed from the standard CPMG echo (compare with 611 shown in FIG. 10A). The 90-90-degree pulse pair CPMG signal has a central peak 711, whose amplitude has decreased slightly, and side lobes 713a, 713b, whose spacing from the central peak will increase as $\Delta t_2$ increases. With matched filtering, little loss in CPMG signal amplitude occurs with a split 180-degree CPMG sequence. The out-of-phase signal reveals some SSFP signals appearing at approximately $\Delta t_2$ after the pair of 90-degree pulses 721a and, having an opposite phase, at approximately $\Delta t_2$ before the next pair of 90-degree pulses 721b. At longer times, as shown in FIG. 11B, the SSFP signals 771a, 771b grow larger. Smaller SSFP echoes, not observable in FIG. 11B, also run through the time interval between 90-degree pairs. As expected, the CPMG signal at longer times has decayed away and is no longer observable 761.

FIGS. 12 and 13 show the integrated CPMG and SSFP signals (using appropriately matched filters) as a function of the length of time a standard and a split 180-degree CPMG sequence, respectively, were applied to a doped water sample in a gradient field. The signals have been normalized to the amplitude of the initial standard CPMG echo. FIG. 12 shows the results from a standard CPMG sequence, showing the familiar decay of the CPMG echoes 801. The SSFP signal 803 is barely visible, having been obscured by the dead time and interference with the next pulse. FIG. 13 shows the results from a 90-90-degree split CPMG sequence. The initial split CPMG amplitude 901 is slightly smaller than the initial standard CPMG amplitude, but the split CPMG signal displays the same decay as the standard CPMG signal. Thus, the $T_2$ distribution can be obtained from the split 180-degree CPMG sequence in the same manner as from the standard CPMG sequence. The SSFP signal 903 is readily observable during the split 180-degree CPMG sequence, and can be seen to grow to a finite steady-state value.

In the 90-90-degree split CPMG example discussed above, the $\Delta t_2/\Delta t_1$ ratio determines the CPMG signal shape and the SSFP signal locations. As the $\Delta t_2/\Delta t_1$ ratio increases from zero, the 90-90-degree pulse pair acts less like a single 180-degree pulse, and the CPMG signal decreases as the amplitude of the central CPMG echo peak decreases and the CPMG side lobes move closer to the magnetic pulses and become obscured. At the same time, the 90-90-degree pulse pair moves some of the SSFP echoes away from the magnetic (RF) pulses and away from the receiver dead time and other hardware delays. However, as $\Delta t_2/\Delta t_1$ increases from zero, this SSFP signal amplitude decreases, and, as $\Delta t_2/\Delta t_1 \rightarrow 0.5$, the SSFP signals will rejoin and, given their opposite phases, cancel each other out; as $\Delta t_2/\Delta t_1$ increases beyond 0.5, i.e., $\Delta t_2/\Delta t_1 > 0.5$, the SSFP signals will re-appear, but typically with smaller amplitude. Thus, $\Delta t_2/\Delta t_1$ is typically chosen to be relatively small, at least <0.5, which helps maximize the amplitudes of both CPMG and SSFP signals, but large enough to move the SSFP signal away from dead time, hardware delays and interference with the pulses.

To increase SSFP signal-to-noise, in addition to the odd and even phase cycling described above, the phases of the individual pulses that make up a split 180-degree pulse may be modified to help eliminate some tool ringing and other hardware noise. For example, using a $90_{+y}$-$90_{31\ y}$-degree pulse pair CPMG sequence and adding the resulting SSFP signals to the signals obtained using a $90_{+y}$-$90_{+y}$-pulse pair CPMG sequence can help eliminate some tool ringing. Alternating the phase of the split 180-pulse, by applying a $90_{+y}$-$90_{+y}$-degree split CPMG sequence followed by a $90_{-y}$-$90_{-y}$-degree split CPMG sequence, can help eliminate some of the tool offsets. Alternating a $90_{+y}$-$90_{+y}$-degree pulse pair with a $90_{-y}$-$90_{-y}$-degree pulse pair within one CPMG sequence can help eliminate tool ringing as well as tool offsets.

As applied to well logging, the SSFP signal, either alone or in combination with CPMG signals, can be used to extract information that may be useful in evaluating an earth formation. The steady state magnetization $M_{ss}$ of the SSFP signal depends on $M_0$ and the $T_1/T_2$ ratio (see equation (7) above). As is well known in the art, $M_0$, the total number of spins, may be determined from the initial CPMG signal amplitude. Assuming the spins are allowed enough time to reach thermal equilibrium before the CPMG sequence is applied, the initial CPMG signal amplitude will provide a direct measure of $M_0$. In NMR well logging, where the spins are found in hydrogen-rich fluids (i.e., hydrocarbons and water) contained in the earth formation pores, $M_0$ provides an indication of formation porosity ($\phi$). By comparing the initial CPMG amplitude and the steady-state SSFP value, both the porosity ($\phi$) and $T_1/T_2$ ratio of a region within an earth formation can be determined.

Alternatively, formation porosity ($\phi$) may be known or indicated by other measurements, e.g., from neutron logging measurements, in which case CPMG data would not be needed to estimate $M_0$. The SSFP signal may then provide the $T_1/T_2$ ratio without CPMG data.

Within a given region of an earth formation, the average $T_1/T_2$ ratio, i.e., $<T_1/T_2>$, is not expected to vary greatly, so once $<T_1/T_2>$ is known, the steady-state SSFP signal amplitude provides a direct measure of $M_0$ and so can be used by itself to determine the formation porosity ($\phi$). In formations with short $T_2$'s, e.g., due to bound fluid, the SSFP signal is expected to provide a more reliable NMR porosity measurement than the CPMG signal because the CPMG signal often decays too quickly for its initial amplitude to be reliably measured. The SSFP signal, on the other hand, grows to a finite value and can be built up over time, and so should provide a more reliable indication of bound fluid volume and porosity for short $T_2$'s than the CPMG signal.

In NMR logging, the transient behavior of the CPMG signal is typically fit to a distribution of $T_2$'s, instead of a single $T_2$ value. The extracted $T_2$ distribution in turn provides information about the pore size distribution in the region of investigation within the formation. Similarly, the transient behavior of the SSFP signal in well logging depends on a distribution of $T_1$'s and $T_2$'s (see equation (6) above). Comparing the distribution of decay rates from the CPMG and the SSFP signals should yield both a $T_1$ and a $T_2$ distribution.

The SSFP signal may also provide information on diffusion of spins, for example, through the pore structure of an earth formation or other rock. In the presence of a gradient field, each spin will experience different magnetic field strengths as it diffuses through the static field. This diffusion effect appears in the CPMG signal as an additional decay, $$\frac{1}{T_{2,diffusion}} = \frac{1}{12}\gamma^2 g^2 D t_E^2,$$

where $\gamma$ is the gyromagnetic ratio, g is the gradient field strength, D is the diffusion coefficient, and $t_E$ is the echo spacing of the CPMG spin echoes.

The sensitivity of the SSFP magnetization to diffusion effects depends on the interplay of the rotation angle of the periodically repeating magnetic pulse ($\theta$) and the relative durations of $T_1$, $T_2$, the period of the repeating magnetic pulse ($\tau_1$), and a diffusion time, defined as $$T_D \equiv \frac{1}{\gamma^2 g^2 D \tau_1^2}.$$

In general, for SSFP resulting from $\theta \approx 180$-degrees, the SSFP signal is more sensitive to diffusion effects than the CPMG spin echoes because the SSFP signal has contributions from many different coherence pathways, some of which intrinsically have a higher diffusion sensitivity than the single coherence pathway that produces the CPMG spin echo (for $\theta \approx 180$-degrees, the spins generally do not sample these higher coherence pathways, so the diffusion sensitivity of the SSFP signal is similar to that of the CPMG spin echo and may be taken into account with an additional $T_2$-component, $$\frac{1}{T_{2,diffusion}} = \frac{1}{3}\gamma^2 g^2 D \tau_1^2).$$

Diffusion typically will result in a decrease in the amplitudes of the observed pre-pulse SSFP echo and the after-pulse FID. A more thorough analysis of the effect of diffusion on SSFP is provided in D. E. Freed, et al., "Steady-State Free Precession Experiments and Exact Treatment of Diffusion in a Uniform Gradient," J. Chem. Phys., vol. 115, no. 9, pp. 4249–4258 (2001).

The invention has been described herein with reference to certain examples and embodiments. It will, however, be evident that various modifications and changes may be made to the embodiments described above. For example, the split 180-degree CPMG sequence may be implemented with an asymmetric split (e.g., 30–150 degree split), or by splitting the 180-degree pulse among more than two pulses (e.g., 60-60-60 degree split), or with an off-resonance split 180-degree pulse (e.g., 55-55-55 degree split), while still generating measurable CPMG and SSFP signals; the shape of the CPMG echo will vary with the type of 180-degree split, however.

Also, it should be noted that, where CPMG data is not acquired, the SSFP signal may be generated by periodically applying a (set or composite of) magnetic pulse(s) having $\theta \approx 180$-degrees. As discussed previously, in some cases where formation porosity is known, e.g., from other measurements, the SSFP signal may be analyzed to extract a $T_1/T_2$ ratio without the need for CPMG data, and the SSFP signal may be generated using a magnetic pulse sequence, such as a DEFT sequence, that does not generate CPMG signals. Additionally, certain diffusion sensitive NMR measurements may preferably utilize a SSFP signal generated with a (set or composite of) magnetic pulse(s) having a rotation angle $\theta$ greater than the Ernst angle, $\alpha_E = \cos^{-1}[\exp(-\tau_1/T_1)]$, and less than 180-degrees, i.e., $\alpha_E < \theta < 180$-degrees, which generally has greater diffusion sensitivity (as $T_D \rightarrow T_2$) than the SSFP signal generated with $\theta \approx 180$-degree pulses.

Various other modifications and changes may be made without departing from the scope of the invention as set forth in the claims.

We claim:

1. A method of evaluating an earth formation comprising:
   a) introducing a nuclear magnetic resonance logging tool into a borehole that traverses the earth formation;
   b) using the nuclear magnetic resonance logging tool to apply a sequence of magnetic pulses to a region within the earth formation;
   c) using the nuclear magnetic resonance logging tool to detect a steady-state free precession (SSFP) signal from the region; and
   d) analyzing the SSFP signal to extract information about the region.

2. The method of claim 1, wherein the sequence of magnetic pulses comprises a periodically repeating magnetic pulse.

3. The method of claim 1, wherein the sequence of magnetic pulses comprises a periodically repeating composite magnetic pulse.

4. The method of claim 1, wherein the sequence of magnetic pulses comprises a periodically repeating set of magnetic pulses.

5. The method of claim 1, wherein the sequence of magnetic pulses comprises a driven equilibrium Fourier transform (DEFT) sequence.

6. The method of claim 1, wherein the sequence of magnetic pulses comprises a Carr-Purcell-Meiboom-Gill (CPMG) sequence.

7. The method of claim 1, wherein the sequence of magnetic pulses comprises a 90-degree pulse followed by a periodically repeating set of 180-degree pulses wherein at least one of the 180-degree pulses within each set has a different pulse width.

8. The method of claim 1, wherein the sequence of magnetic pulses comprises a periodically repeating 180-degree pulse followed by a series of refocusing pulses.

9. The method of claim 8, wherein the refocusing pulse comprises a composite pulse.

10. The method of claim 1, wherein the sequence of magnetic pulses comprises a periodically repeating off-resonance 180-degree pulse.

11. The method of claim 1, wherein the sequence of magnetic pulses comprises an initial pulse followed by a periodically repeating split 180-degree pulse.

12. The method of claim 11, wherein the split 180-degree pulse comprises two 90-degree pulses separated by a time spacing.

13. The method of claim 12, wherein the time spacing is smaller than the period of the periodically repeating split 180-degree pulse.

14. The method of claim 11, wherein the split 180-degree pulse comprises an off-resonance split 180-degree pulse.

15. The method of claim 1, further comprising repeating steps (b) and (c) a plurality of times.

16. The method of claim 15, further comprising varying the phase of at least one of the magnetic pulses before repeating step b).

17. The method of claim 1, wherein analyzing the SSFP signal comprises calculating a bound fluid volume for the region.

18. The method of claim 1, wherein analyzing the SSFP signal comprises extracting information about the porosity of the region.

19. The method of claim 1, wherein analyzing the SSFP signal comprises calculating a ratio of a longitudinal relaxation time constant to a transverse relaxation time constant.

20. A logging apparatus comprising:
means for applying a static magnetic field to a region of an earth formation traversed by a borehole;
means for applying a sequence of magnetic pulses to the region;
means for detecting a steady state free precession (SSFP) signal from the region; and
means for analyzing the SSFP signal to extract information about the region of the earth formation.

21. A method of evaluating an earth formation, comprising:
a) introducing a nuclear magnetic resonance logging tool into a borehole that traverses the earth formation;
b) applying a static magnetic field from the logging tool to a region within the earth formation;
c) applying a CPMG sequence to the region, the CPMG sequence comprising an initial pulse followed by a series of 180-degree pulses;
d) collecting magnetic resonance data from the region;
e) combining the collected magnetic resonance data to observe CPMG spin echoes;
f) combining the collected magnetic resonance data to observe a SSFP signal; and
g) analyzing the observed CPMG spin echoes and the observed SSFP signal to determine a characteristic of the region.

22. The method of claim 21, further comprising:
h) reversing the phase of the initial pulse and repeating steps (c)–(d).

23. The method of claim 22, further comprising repeating step (h) a plurality of times.

24. The method of claim 23, wherein combining the detected magnetic resonance data to observe CPMG spin echoes comprises subtracting the detected data from successive applications of the CPMG sequence.

25. The method of claim 23, wherein combining the detected magnetic resonance data to observe the SSFP signal comprises adding the detected data from successive applications of the CPMG sequence.

26. The method of claim 21, wherein the CPMG sequence comprises off-resonance pulses.

27. The method of claim 21, wherein the series of 180-degree pulses comprises a periodically repeating set of 180-degree pulses wherein at least one of the 180-degree pulses within each set has a different pulse width.

28. The method of claim 21, wherein the series of 180-degree pulses comprises a periodically repeating split 180-degree pulse.

29. The method of claim 25, wherein the split 180-degree pulse comprises a pair of 90-degree pulses.

30. The method of claim 29, wherein the pair of 90-degree pulses comprises a $90_{+y}$-degree pulse and a $90_{-y}$-degree pulse.

31. The method of claim 29, wherein the series of 180-degree pulses comprises alternating pairs of $90_{+y}$-degree and $90_{-y}$-degree pulses.

32. The method of claim 29, further comprising reversing the phase of the $90_y$-degree pulses and repeating steps (c)–(d).

33. The method of claim 28, wherein the split 180-degree pulses comprise a plurality of pulses designed to result in an approximate 180-degree rotation.

34. The method of claim 21, further comprising, after applying the CPMG sequence, applying a series of refocusing pulses to the region of investigation.

35. The method of claim 34, wherein the series of refocusing pulses comprises composite pulses.

36. The method of claim 21, wherein analyzing the observed CPMG spin echoes and the observed SSFP signal comprises extracting a ratio of a longitudinal relaxation time constant to a transverse relaxation time constant.

37. A logging apparatus comprising:
means for applying a static magnetic field to a region within an earth formation;
means for applying a CPMG sequence to the region;
means for collecting magnetic resonance data from the region;
means for varying the phase of at least one magnetic pulse of the sequence;
means for combining the collected magnetic resonance data to observe CPMG spin echoes;
means for combining the detected magnetic resonance data to observe a steady state free precession (SSFP) signal; and
means for analyzing the observed CPMG spin echoes and the observed SSFP signal to determine a characteristic of the region.

* * * * *